United States Patent
Apodaca

(10) Patent No.: US 9,837,269 B2
(45) Date of Patent: Dec. 5, 2017

(54) DEPOSITION METHOD FOR PLANAR SURFACES

(71) Applicant: HGST, Inc., San Jose, CA (US)

(72) Inventor: Mac D. Apodaca, San Jose, CA (US)

(73) Assignee: HGST, INC., San Jose, CA (US)

( * ) Notice: Subject to any disclaimer, the term of this patent is extended or adjusted under 35 U.S.C. 154(b) by 30 days.

(21) Appl. No.: 14/956,173

(22) Filed: Dec. 1, 2015

(65) Prior Publication Data

US 2016/0155636 A1    Jun. 2, 2016

Related U.S. Application Data

(60) Provisional application No. 62/086,359, filed on Dec. 2, 2014.

(51) Int. Cl.
*H01L 21/06* (2006.01)
*H01L 21/02* (2006.01)
*H01L 29/26* (2006.01)

(52) U.S. Cl.
CPC .. *H01L 21/02568* (2013.01); *H01L 21/02381* (2013.01); *H01L 21/02485* (2013.01); *H01L 21/02494* (2013.01); *H01L 29/26* (2013.01)

(58) Field of Classification Search
CPC ... H01L 45/06; H01L 45/144; H01L 45/1233; H01L 45/1683; H01L 45/1616; H01L 21/02568; H01L 21/02485; H01L 21/02381; H01L 21/02494; H01L 29/26
USPC .......... 257/E45.002, 616, E21.068; 438/102, 438/382
See application file for complete search history.

(56) References Cited

U.S. PATENT DOCUMENTS

| | | | |
|---|---|---|---|
| 2007/0202636 A1* | 8/2007 | Choi | C23C 16/5096 438/149 |
| 2010/0267195 A1* | 10/2010 | Marsh | C23C 16/28 438/102 |
| 2011/0032753 A1* | 2/2011 | An | G11C 11/56 365/163 |
| 2011/0180905 A1* | 7/2011 | Zheng | C23C 16/305 257/616 |
| 2011/0260132 A1* | 10/2011 | Zheng | C23C 16/305 257/2 |
| 2015/0060840 A1* | 3/2015 | Nishimura | H01L 51/5275 257/40 |
| 2017/0034906 A1* | 2/2017 | Myung | H05K 5/0017 |

* cited by examiner

*Primary Examiner* — Lex Malsawma
*Assistant Examiner* — Nduka Ojeh
(74) *Attorney, Agent, or Firm* — Patterson & Sheridan, LLP

(57) ABSTRACT

A method for producing a substantially planar surface for semiconductor processing to improve lithography, planarization, and other process steps that benefit from a flat substrate. The method includes depositing a first alloy to form a first layer on a substrate. The first layer has a center high deposition, meaning the height in the center of the substrate is higher than the height at the edges of the substrate. The method further includes depositing a second alloy on the first layer to form a second layer. The first alloy has a different composition than the second alloy. In such a method the net deposition is substantially planar reducing or eliminating deposition induced long-range distortions that might occur across a substrate.

12 Claims, 3 Drawing Sheets

DEPOSITION METHOD FOR PLANAR SURFACES

CROSS-REFERENCE TO RELATED APPLICATIONS

This application claims benefit of U.S. Provisional Patent Application Ser. No. 62/086,359, filed Dec. 2, 2014, which is herein incorporated by reference.

BACKGROUND OF THE DISCLOSURE

Field of the Disclosure

Embodiments of the present disclosure generally relate to the manufacture and processing of semiconductor wafers, and more particularly to methods for keeping the surface of a wafer flat following deposition to improve lithography, planarization, and other process steps that benefit from a more perfectly flat wafer.

Description of the Related Art

Semiconductor manufacturing is typically performed on the flat surface of a substrate such as a crystalline silicon wafer, quartz wafer, glass or the like. Very often during processing, materials will be deposited or grown on the surface and to fill in surface features. Some deposition techniques, such as Atomic Layer Deposition (ALD), will fill small features very effectively, but on the wafer surface, will vary in thickness quite significantly from the center of the wafer to the edge.

When this happens, a circular crystalline silicon wafer can end up with a mound in its center. This mound shape will adversely affect subsequent processing steps such as etching, Chemical Mechanical Polishing, (CMP), lithographic exposures, to name a few. For example, when etching, the material deposited on the surface will be removed around the edges before it is removed in the center and, as a result, continuing the etch to clear the center area will cause over-etching of the features below the deposited material around the edges. In lithographic exposures, a domed wafer might be closer to the exposure source at the edges than at the center of the wafer resulting in focusing errors tor which corrections would have to be made. In a CMP process step, the edges of the wafer might polish more quickly than the center due to the center being protected by the dome of excess material in the center.

As such, there is a need in the art for a method of producing a flat wafer for further processing.

SUMMARY OF THE DISCLOSURE

The present disclosure generally relates to a method for producing a substantially planar surface for semiconductor processing to improve lithography, planarization, and other process steps that benefit from a flat substrate. The method includes depositing a first alloy to form a first layer on a substrate. The first layer has a center high deposition, meaning the height in the center of the substrate is higher than the height at the edges of the substrate. The method further includes depositing a second alloy on the first layer to form a second layer. The first alloy has a different composition than the second alloy. In such a method the net deposition is substantially planar reducing or eliminating deposition induced long-range distortions that might occur across a substrate.

In one embodiment, a method for producing a substantially planar surface for semiconductor processing is disclosed. The method includes depositing a first material over a top surface of a substrate to thereby fill a first and a second set of recesses with the first material. The first set of recesses extends into the substrate proximate a center of the substrate and the second set of recesses extends into the substrate proximate an edge of the substrate. The method also includes depositing the first material over the filled first and second recesses to form a non-uniform thickness profile over the filled first and second set of recesses, where a thickness of the first material extending over the filled first set of recesses is different from a thickness of the first material extending over the filled second set of recesses, and depositing a second material over the first material. The second material has a non-uniform thickness profile substantially complementary to the non-uniform thickness profile of the first material, and a top surface of the second material that is substantially planar.

In another embodiment, a method for producing a substantially planar surface is disclosed. The method includes depositing a first material onto a substrate to form a first layer, and depositing a second material onto the first layer to form a second layer. The first material is a first chalcogenide alloy. The substrate has one or more openings there through. The first layer has a first height greater than a second height. The second material is a second alloy of different composition than the first chalcogenide alloy. The second material has a top surface with a first height that is substantially equal to a second height.

In another embodiment, a device is disclosed. The device includes a substrate layer with one or more openings there through, a first chalcogenide alloy layer with a first height that is greater than a second height, and a second alloy layer with a first height that is substantially equal to a second height.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure relates to a method for producing a substantially planar surface for semiconductor processing to improve lithography, planarization, and other process steps that benefit from a flat substrate. The method includes depositing a first alloy to form a first layer on a substrate. The first layer has a center high deposition, meaning the height in the center of the substrate is higher than the height at the edges of the substrate. The method further includes depositing a second alloy on the first layer to form a second layer. The first alloy has a different composition than the second alloy. In such a method the net deposition is substantially planar reducing or eliminating deposition induced long-range distortions that might occur across a substrate.

Figure 1A:
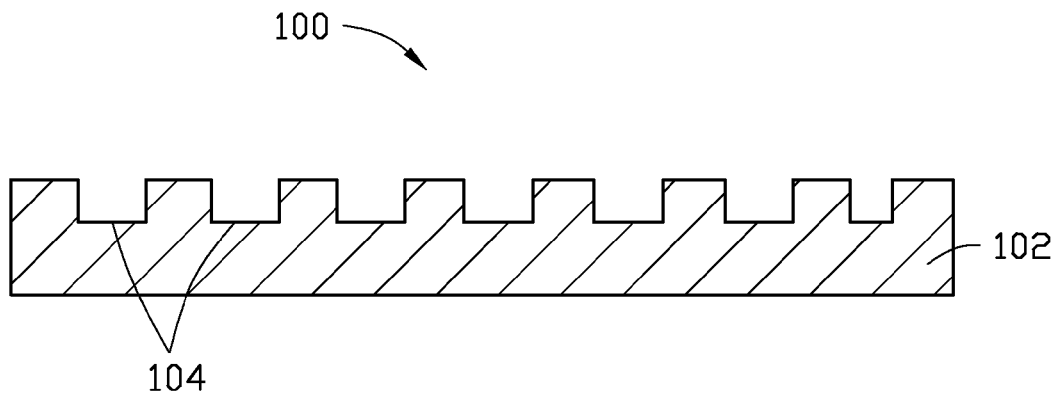
FIGS. 1A-1C show a schematic representation of a wafer shown in cross-section according to one embodiment.
Figure 1B:
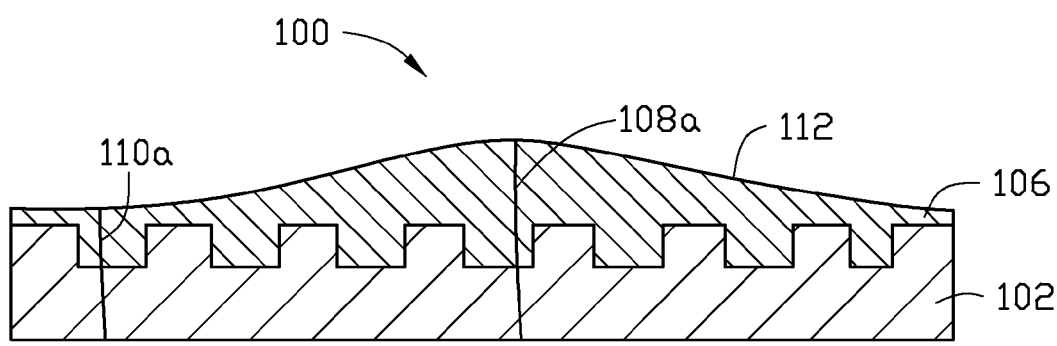
Figure 1C:
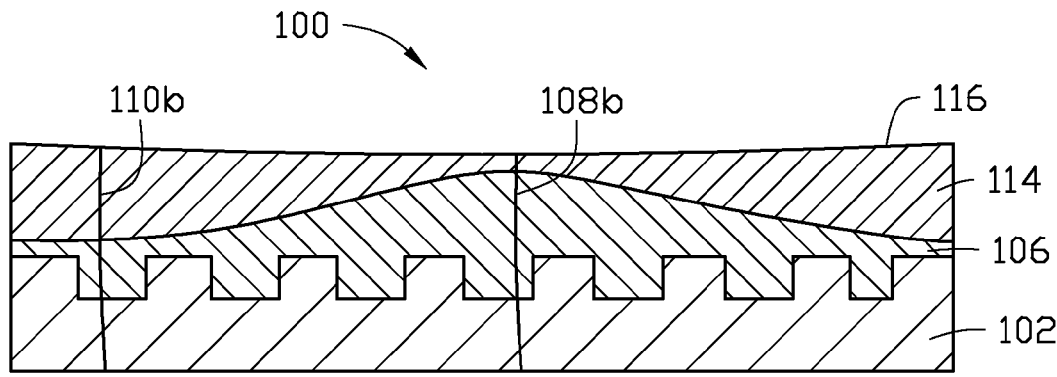

Embodiments of the present disclosure are means to maintain surface planarity during deposition (e.g., ALD or chemical vapor deposition (CVD)) of alloys into features extending downwardly from the wafer surface. FIGS. 1A-1C show the deposition of device 100 to form a substantially planar surface. Referring to FIG. 1A, a wafer or other substrate 102 is typically flat before alloy deposition. Etched features, such as holes and channels 104, extend downwardly from the wafer's surface. In one embodiment, the substrate 102 may include several layers. The substrate may be a circular crystalline silicon wafer.

In another embodiment, the substrate may be an epitaxial silicon diode wafer. In another embodiment, the substrate may be any generic substrate that includes one or more layers. In one embodiment the holes and channels 104 may have been formed in the substrate 102 by depositing a masking layer on top of the substrate 102, patterning the masking layer to a desired shape of the trench, hole, or channel 104, etching the substrate to form a trench, hole, or channel 104 there through, and then removing the masking layer. In one embodiment, the holes 104 may have an aspect ratio between 2:1 and 20:1. In one embodiment, the holes or channels 104 may be recesses. The recesses may have a first set of recesses proximate the center of the substrate 102 and a second set of recesses extending into the substrate proximate the edge of the substrate 102. It is often desirable to fill these features with materials such as Chalcogenide or other alloys. While these alloys will fill in the features while maintaining their alloy compositions, on the surface these alloys can have a tendency to deposit more thickly in some areas than others.

Often, this thickness variation can be a function of how close the area is to the center or edge of the wafer. Since certain tools can cause differing gas pressures and/or temperatures in different areas of the deposition chamber, and these differing gas pressures and/or temperatures can vary from the center of the chamber to the edge, the resulting thickness of the deposited material can vary from the center to the edge of the wafer. In some cases, the thickest area of the deposited film is in the center whereas in other cases the thickest area of the deposited film can occur closer to the edge of the wafer. Furthermore, in a given tool's chamber, the location of the thickest area of the deposited film can vary depending upon the particular alloys being deposited. Embodiments of the present disclosure include techniques for depositing a first desired material 106, as seen in FIG. 1B, such that etched features, such as holes and channels 104 are filled with that desired material 106 and then depositing a second related material 114, as seen in FIG. 1C, having a generally opposite deposition profile in order to generally planarize the surface.

Referring now to FIG. 1B, the first deposition of device 100 is shown. It may be understood that depositing the first desired material forms a first layer 106 such that the first layer is made of the first desired material. The first desired material 106 may be chalcogenide alloy such as Germanium-Antimony-Tellurium (GST). In one embodiment, the first desired material 106 may be the first chalcogenide alloy GST with the stoichiometry of $Ge_2Sb_2Te_5$. In one embodiment, the first material layer 106 may be deposited over a top surface or first surface of the substrate 102 to fill a first and a second set of recess 104. Deposition of the first material 106 may continue in a simultaneous manner until a non-uniform thickness profile is formed over the first and second set of recesses 104. Deposition of the first material and the second material may be performed by chemical vapor deposition (CVD), atomic layer deposition (ALD), or similar processes. In another embodiment, the deposition of the first material 106 may be deposited in two separate steps. After deposition, the first material layer 106 has a top surface 112. In other words, after deposition of the first material 112 of the first material 106 to the bottom surface of the substrate 102, is greater than the height 110a near the edges of the substrate 102, measured from the top surface 112 of the first material layer 106 near the edges of the substrate to the bottom surface of the substrate 102.

As seen in FIG. 1C, a second material 114 is deposited over the first material 106 to form a second layer 114. It may be understood that depositing the second desired material forms a second layer 114 such that the second layer is made of the second desired material. In one embodiment, the second material layer 114 includes a top surface 116 that is substantially planar. After deposition of the second material layer 114, the height 108b of the top surface 116 of the second material layer 114 near the center of the substrate 102 is substantially equal to the height 110b of the top surface of the second material 114 near the edges of the substrate 102, measured from the top surface 116 to the bottom of the substrate 102. The layer stack or device 100 includes a substrate layer 102—where the substrate has one or more openings 104 there through, a first layer 106, and a second layer 114.

Figure 2:
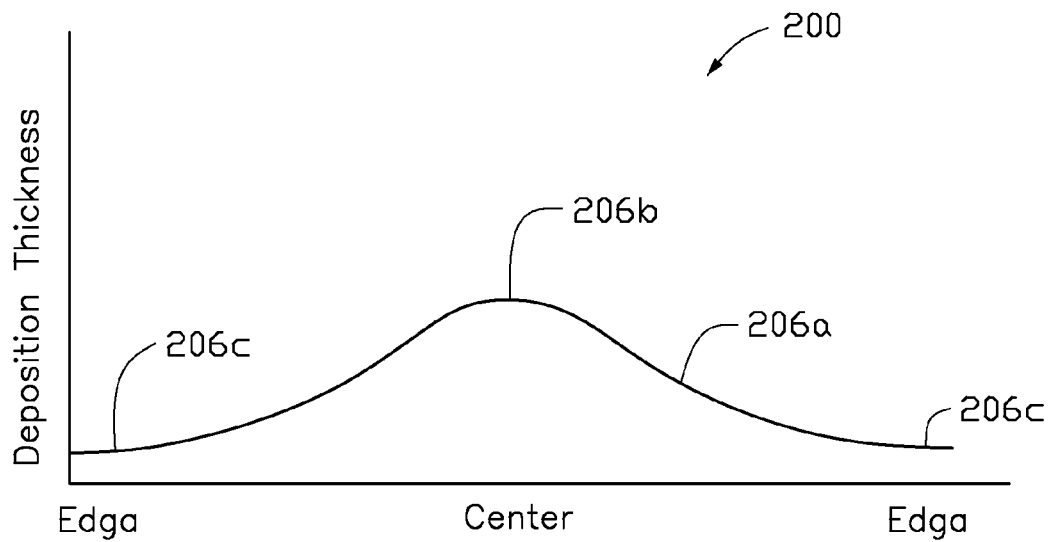
FIG. 2 shows a plot of a normal flat wafer following distortion inducing deposition of an alloy.

In FIG. 2 a thickness plot 200 of a possible deposition profile is shown for an alloy, GST. In one embodiment, the thickness profile 206a is substantially similar to the thickness profile of the first material layer 106 after it is deposited over a substrate 102 during processing. In one embodiment, the thickness profile 206a may be of the alloy $Ge_2Sb_2Te_5$. As can be noted from the plot, the thickest area occurs in the center of the wafer. The thickness profile 206a has a non-uniform thickness profile with an apex or greatest height near the center 206b. It should be understood that the center 206b may be the center of the substrate 102 and the edges 206c may be the edges of the substrate 102. During deposition, any surface features, such as holes or channels, will be filled in. It may be understood that the holes or channels (not shown in FIG. 2) may be the holes or channels 104 of substrate 102. However, to ensure that the features closer to the edge 206c (where the deposition rate is lower) get filled in completely, the deposition time must be long enough to insure complete coverage at the wafer's edge. However, since the wafer's center is experiencing a greater deposition rate, the buildup on the center of the surface (after the surface features have been filled in) will be significantly greater than it will be at the edge.

Figure 3:
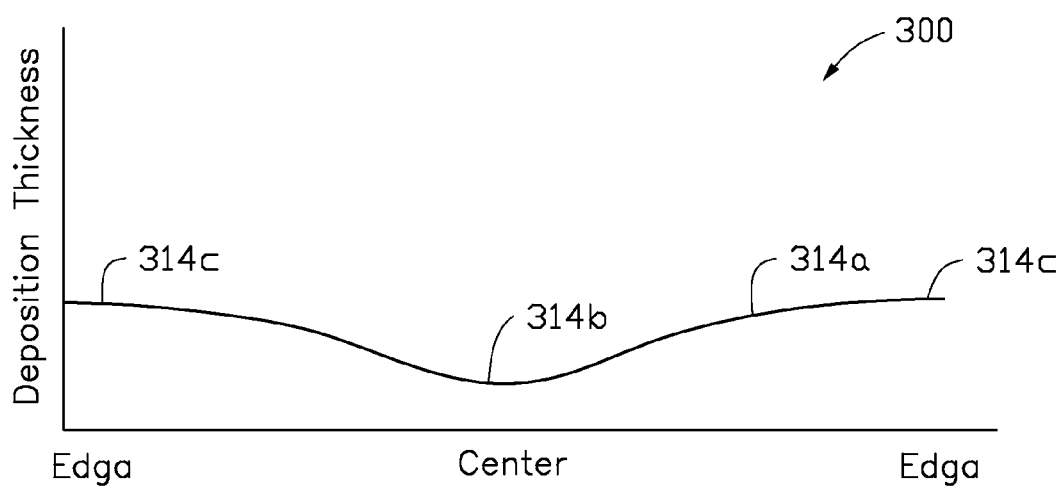
FIG. 3 shows a plot of a normal flat wafer following distortion inducing deposition of an alloy.

In FIG. 3, a thickness plot 300 of a possible deposition profile is shown for a different alloy. In one embodiment the thickness plot 300 is of a second alloy Antimony-Tellurium (ST), though other alloys may be used. As can be noted from the plot, the thickness profile 314a for a second alloy shows the thickest area occurs near the edge 314c of the wafer. The second alloy 314a may be the second material forming the second layer 114 in FIG. 1C. It should be understood that the center 314b may be the center of a substrate 102 and the edges 314c may be the edges of the substrate 102. During deposition, the wafer's edge 314c experiences a greater deposition rate and the buildup on the surface near the edge 314c will be significantly greater than it will be at the center 314b. Since the alloy plotted in FIG. 2 may comprise all of the elements comprised by the alloy plotted in FIG. 3, these two alloys may be deposited using the same tool in sequence by turning off the source of the elements comprised by the alloy plotted in FIG. 2 that are not also comprised by the alloy plotted in FIG. 3. In another embodiment, all three source elements, GST, continue to flow during deposition, but temperature adjustments directly affects the absorption on the substrate such that the thickness profile after the temperature adjustment is similar to the thickness profile 116. In other words, absorption on the substrate is affected by the temperature such that the substrate's edge experiences greater deposition rate and buildup than the center of the substrate. The result of depositing the two alloys shown in FIGS. 2 and 3 sequentially is shown in FIG. 4.

Figure 4:
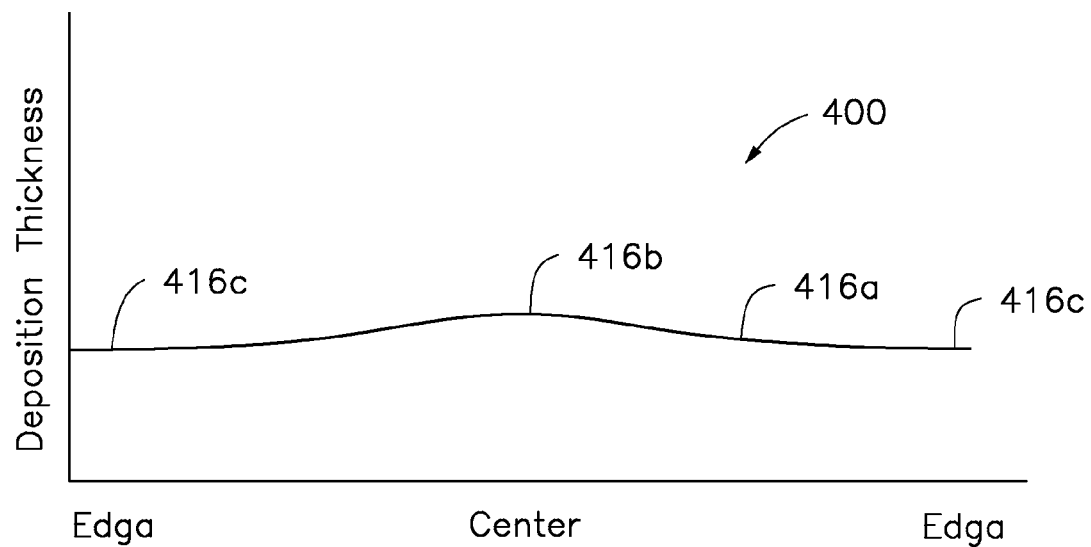
FIG. 4 shows a plot of a distortion corrected deposition on a norm at flat wafer following deposition of a first alloy followed by deposition of a second alloy.

In FIG. 4, a thickness plot 400 of a possible deposition profile is shown for the sequential deposition of two different alloys. In one embodiment, the thickness profile 416a may be the thickness profile following sequential deposition of a chalcogenide alloy such as GST and a different alloy such as ST. In one embodiment, the thickness profile 416a is substantially similar to the thickness profile of the device 100 following deposition of first material layer 106 and second material 114 over a substrate 102 during processing. As is evident from FIG. 4, the thickness profile of the first chalcogenide alloy such as GST deposition is largely offset by the thickness profile of the second different alloy such as ST, resulting in a combined surface profile that is substantially planar (e.g., planar to within ±10%, or even to within ±5%). As can be noted from the plot, the thickness profile 414a for the combined deposition of the first alloy and the second alloy shows the thickness occurring near the edge 414c of the wafer is substantially similar to the thickness of the center 416b of wafer. It should be understood that the center of the plot in FIG. 4 may be the center of a wafer and the edges of the plot may be the edges of a wafer. In one embodiment, the resulting more-planar surface profile 416a may now be further planarized by chemical mechanical planarization (CMP), by etching or by CMP followed by etching.

In other embodiments, variations will be apparent—in which many different alloys can be deposited according to the present disclosure, with correction of the surface profile being made by removing one or more elements of the alloy being deposited so as to correct for the desired profile. Likewise, a less inclusive alloy such as ST can be deposited first (if this is the alloy desired to fill in any surface features) followed by deposition of a second alloy whereby one or more additional elements are introduced into this second alloy being deposited to correct the surface profile. For an even more planar end result, it is contemplated by the present disclosure that other' empirically derived alloys (in addition to the initial allow and the subsequent alloy) can be deposited in sequence to further perfect the resulting surface profile. It will be apparent to those skilled in the art that the change in thickness of the last deposited alloy will be generally equal and opposite to the change in the surface profile of the previously deposited alloy or alloys. The more precisely matched that the change in thickness of the last deposited alloy is compared to the change in the surface profile of the previously deposited alloy or alloys (in opposite profile), the more planar the end result.

The present disclosure is a method for producing a substantially planar surface for semiconductor processing to improve lithography, planarization, and other process steps that benefit from a flat substrate. By depositing a first alloy to form a first layer on a substrate with a center high deposition, and depositing a second alloy of different composition on the first layer to form a second layer, the net deposition is substantially planar reducing or eliminating deposition induced long-range distortions that might occur across a substrate.

The foregoing description of an example of the preferred embodiment of the disclosure and the variations thereon have been presented for the purposes of illustration and description. It is not intended to be exhaustive or to limit the disclosure to the precise forms disclosed, and the scope thereof is determined by the claims that follow.

What is claimed is:

1. A method for producing a substantially planar surface for semiconductor processing, the method comprising:
depositing a first material over a top surface of a substrate to thereby fill a first and a second set of recesses with the first material, wherein the substrate comprises therewithin (i) the first set of recesses extending into the substrate proximate a center of the substrate, and (ii) the second set of recesses extending into the substrate proximate an edge of the substrate;
depositing the first material over the filled first and second sets of recesses to form a non-uniform thickness profile over the filled first and second sets of recesses, whereby a thickness of the first material extending over the filled first set of recesses is different from a thickness of the first material extending over the filled second set of recesses;
depositing a second material over the first material, wherein (i) the second material has a non-uniform thickness profile substantially complementary to the non-uniform thickness profile of the first material, and (ii) a top surface of the second material is substantially planar and wherein the first and the second material are different alloys.

2. A method for producing a substantially planar surface for semiconductor processing, the method comprising:
depositing a first material over a top surface of a substrate to thereby fill a first and a second set of recesses with the first material, wherein the substrate comprises therewithin (i) the first set of recesses extending into the substrate proximate a center of the substrate, and (ii) the second set of recesses extending into the substrate proximate an edge of the substrate;

depositing the first material over the filled first and second sets of recesses to form a non-uniform thickness profile over the filled first and second sets of recesses, whereby a thickness of the first material extending over the filled first set of recesses is different from a thickness of the first material extending over the filled second set of recesses;

depositing a second material over the first material, wherein (i) the second material has a non-uniform thickness profile substantially complementary to the non-uniform thickness profile of the first material, and (ii) a top surface of the second material is substantially planar wherein (i) the first material is an alloy having one or more constituent elements, and (ii) the second material is an alloy having one or more, but not all, of the constituent elements of the first material.

3. A method for producing a substantially planar surface for semiconductor processing, the method comprising:

depositing a first material over a top surface of a substrate to thereby fill a first and a second set of recesses with the first material, wherein the substrate comprises therewithin (i) the first set of recesses extending into the substrate proximate a center of the substrate, and (ii) the second set of recesses extending into the substrate proximate an edge of the substrate;

depositing the first material over the filled first and second sets of recesses to form a non-uniform thickness profile over the filled first and second sets of recesses, whereby a thickness of the first material extending over the filled first set of recesses is different from a thickness of the first material extending over the filled second set of recesses;

depositing a second material over the first material, wherein (i) the second material has a non-uniform thickness profile substantially complementary to the non-uniform thickness profile of the first material, and (ii) a top surface of the second material is substantially planar wherein (i) the second material is an alloy having one or more constituent elements, and (ii) the first material is an alloy having one or more, but not all, of the constituent elements of the second material.

4. A method for producing a substantially planar surface for semiconductor processing, the method comprising:

depositing a first material over a top surface of a substrate to thereby fill a first and a second set of recesses with the first material, wherein the substrate comprises therewithin (i) the first set of recesses extending into the substrate proximate a center of the substrate, and (ii) the second set of recesses extending into the substrate proximate an edge of the substrate;

depositing the first material over the filled first and second sets of recesses to form a non-uniform thickness profile over the filled first and second sets of recesses, whereby a thickness of the first material extending over the filled first set of recesses is different from a thickness of the first material extending over the filled second set of recesses;

depositing a second material over the first material, wherein (i) the second material has a non-uniform thickness profile substantially complementary to the non-uniform thickness profile of the first material, and (ii) a top surface of the second material is substantially planar wherein the first material comprises a chalcogenide alloy.

5. A method for producing a substantially planar surface for semiconductor processing, the method comprising:

depositing a first material over a top surface of a substrate to thereby fill a first and a second set of recesses with the first material, wherein the substrate comprises therewithin (i) the first set of recesses extending into the substrate proximate a center of the substrate, and (ii) the second set of recesses extending into the substrate proximate an edge of the substrate;

depositing the first material over the filled first and second sets of recesses to form a non-uniform thickness profile over the filled first and second sets of recesses, whereby a thickness of the first material extending over the filled first set of recesses is different from a thickness of the first material extending over the filled second set of recesses;

depositing a second material over the first material, wherein (i) the second material has a non-uniform thickness profile substantially complementary to the non-uniform thickness profile of the first material, and (ii) a top surface of the second material is substantially planar wherein (i) the first and second materials each comprise antimony and tellurium, and (ii) only one of the first or second materials comprises germanium.

6. A method for producing a substantially planar surface, the method comprising:

depositing a first material over a top surface of a substrate to thereby fill a first and a second set of recesses with the first material;

depositing the first material onto the substrate to form a first layer, wherein the first material is a first chalcogenide alloy, wherein the first layer has a first height and a second height, and wherein the first height of the first layer is greater than the second height of the first layer; and depositing a second material onto the first layer to form a second layer, wherein the second material is a second alloy of different composition than the first chalcogenide alloy, wherein the second material has a top surface; wherein the top surface of the second layer has a first height and a second height, and wherein the first height of the top surface is substantially equal to the second height of the top surface wherein (i) the second material has a non-uniform thickness profile substantially complementary to a non-uniform thickness profile of the first material, and (ii) a top surface of the second material is substantially planar.

7. The method of claim 6, wherein the second layer includes a top surface, and wherein the top surface is planar.

8. The method of claim 7, wherein the planar surface is formed by chemical mechanical planarization.

9. The method of claim 6, wherein the deposition of the first material and the deposition of the second material is atomic layer deposition.

10. The method of claim 6, wherein the deposition of the first material and the deposition of the second material is chemical vapor deposition.

11. The method of claim 6, wherein the opening has an aspect ratio of between 2:1 to 20:1.

12. The method of claim 6, wherein the second material is an alloy of antimony and tellurium.

* * * * *